United States Patent
Nautiyal et al.

(10) Patent No.: US 7,116,137 B2
(45) Date of Patent: Oct. 3, 2006

(54) METHOD AND SYSTEM FOR REDUCING POWER CONSUMPTION IN DIGITAL CIRCUITRY USING CHARGE REDISTRIBUTION CIRCUITS

(75) Inventors: Vivek Nautiyal, Garhwal (IN); Ashish Kumar, Ranchi (IN)

(73) Assignee: STMicroelectronics PVT. Ltd., Uttar Pradesh (IN)

( * ) Notice: Subject to any disclaimer, the term of this patent is extended or adjusted under 35 U.S.C. 154(b) by 0 days.

(21) Appl. No.: 10/768,962

(22) Filed: Jan. 30, 2004

(65) Prior Publication Data

US 2004/0239368 A1    Dec. 2, 2004

(30) Foreign Application Priority Data

Jan. 30, 2003    (IN)    ................. 76/DEL/03

(51) Int. Cl.
H03B 1/00    (2006.01)

(52) U.S. Cl. .................................................. 327/111

(58) Field of Classification Search ................. 327/108, 327/109, 110, 111, 112
See application file for complete search history.

(56) References Cited

U.S. PATENT DOCUMENTS

| | | | | |
|---|---|---|---|---|
| 5,574,633 A | * | 11/1996 | Prater | 363/59 |
| 5,638,013 A | * | 6/1997 | Iwata et al. | 327/126 |
| 6,147,884 A | * | 11/2000 | Walia | 363/59 |

* cited by examiner

Primary Examiner—Jeffrey Zweizig

(57) ABSTRACT

A method and system for reducing power consumption in digital circuits using charge redistribution include a plurality of signal lines, an intermediate floating virtual source/sink, and a charge redistribution circuit connected to each signal line that isolates the signal line from its source and connects it to the intermediate floating virtual source/sink during an idle period prior to a change of state.

This charge redistribution provides steady state statistical independent advantage due to charge recycling without inserting extra complimentary lines.

20 Claims, 6 Drawing Sheets

Fig-2

METHOD AND SYSTEM FOR REDUCING POWER CONSUMPTION IN DIGITAL CIRCUITRY USING CHARGE REDISTRIBUTION CIRCUITS

TECHNICAL FIELD OF THE INVENTION

This invention relates generally to a method and system for reducing power consumption in digital circuitry using charge redistribution circuits.

BACKGROUND OF THE INVENTION

Advancements in LSI ("Large Scale Integrated") technology continuously bring about reduced transistor sizes and corresponding many-fold increase in the number of transistors that can be mounted on a single chip. However, even though power supply voltage has been lowered considerably, the combination of size and transistor count is such that chip power consumption continues to grow resulting in increased concern with power consumption and dissipation. Power consumption and dissipation concerns have become a limiting factor in the design of LSIs used in microprocessors and other devices that require large-scale, high-speed processing. Thus, reducing power consumption has become a major priority throughout the field of LSI-related development, ranging from computer systems to circuit and device technologies.

Attempts to limit power consumption while reducing power source voltage that have been made so far have however resulted in a decline in transistor drive capability resulting in reduced operating speed. This trade off is not generally acceptable. As a result, there is a pressing need for circuit technology that can reduce energy consumption as well as source voltage without sacrificing operating speed.

Charge recycling provides a mechanism that offers a solution by utilizing charge stored in the distributed capacitance of one or more circuit nets to charge other nets that are at an opposing potential, during intermediate idle periods. This process of charge equalization, allows for a mutual exchange of energy when the data lines are transitioning thereby effectively enabling reuse of electrical power—and consequent reduction in overall power consumption.

Existing methods of charge redistribution are capable of operating with dual rail charge redistribution systems, in which paired complementary signal nets exchange charge locally. To take advantage of the charge redistribution for digital systems, it is mandatory with the present technologies to introduce an extra complementary line with each signal line. This introduction of extra complementary lines results in increased coupling capacitance and increased size of the chip which is undesired. In the case of Deep Sub-Micron ("DSM") technology the increase in coupling capacitance results in a significant increase in the total capacitance thereby resulting in undesirable consequences of reduces operation speed and increased power consumption it is therefore, more important in DSM systems to have a charge redistribution system that does not required the addition of complementary signal lines.

SUMMARY OF THE INVENTION

To address the above-discussed deficiencies of the prior art, a primary object of this invention is to provide a method and system for reducing power consumption in digital circuits using charge redistribution circuits.

To achieve the said objective, an exemplary embodiment of this invention provides a system for reducing power consumption in digital circuits using charge redistribution, comprising:

a plurality of signal lines;
an intermediate floating virtual source/sink, and
a charge redistribution circuit connected to each said signal line that isolates said line from its source and connects it to the intermediate floating virtual source/sink during an idle period prior to a change of state.

The intermediate floating virtual source/sink comprises a charge storage element.

The charge redistribution circuit comprising the transition detector connected to the signal line having two outputs, one of which is connected to the input of a tri-state driver circuit and the other output simultaneously disable the tri-state driver circuit, and enables the control switch to connect its output to the floating source/sink whenever a transition is detected on a signal line.

The charge storage element is a capacitor or a set of capacitors.

The transition detector comprising a delay circuit having its input connected to the signal line and its output connected to the first output of the transition detector and to the first input of a 2-input exclusive-OR or exclusive-NOR gate while the second input of the exclusive-OR/ exclusive-NOR gate is directly connected to the signal line and its output is connected to the second output of the Transition Detector.

The capacitor comprising a floating conductor or a floating conducting mesh optionally coupled to capacitor elements.

The invention further provides an integrated circuit for reducing power consumption in digital circuits using charge redistribution, comprising:

a plurality of signal lines;
an intermediate floating virtual source/sink, and
a charge redistribution circuit connected to each said signal line that isolates said line from its source and connects it to the intermediate floating virtual source/sink during an idle period prior to a change of state.

The intermediate floating virtual source/sink comprises a charge storage element.

The charge redistribution circuit comprising the transition detector connected to the signal line having two outputs, one of which is connected to the input of a tri-state driver circuit and the other output simultaneously disable the tri-state driver circuit and enables the control switch to connect its output to the floating source/sink whenever a transition is detected on a signal line.

The charge storage element is a capacitor or a set of capacitors.

The transition detector comprising a delay circuit having its input connected to the signal line and its output connected to the first output of the transition detects and to the first input of a 2-input exclusive-OR or exclusive-NOR gate while the second input of the exclusive-OR/exclusive-NOR fate is directly connected to the signal line, its output is connected to the second output of the Transition Detector.

The capacitor comprises a floating conductor or a floating conducting mesh optionally coupled to capacitor elements.

The present invention also provides a method for reducing power consumption in digital circuits using charge redistribution, comprising the steps of:

providing a plurality of signal lines;
providing an intermediate floating virtual source/sink, and isolating each signal line from its source circuit and connecting it to the intermediate floating virtual source/sink during an idle period prior to a change of state.

The step of providing an intermediate floating virtual source/sink comprising supplying a charge storage element.

The change of state is identified by detecting a transition on the signal line.

The charge storage element is supplied by connecting a capacitor or a set of capacitors.

The transition is detected by exclusive-NORing or exclusive-ORing the signal with a delayed version of the signal.

The signal line is connected to the intermediate floating virtual source/sink whenever a transition is detected.

The capacitor is provided by a floating conductor or a floating conducting mesh optionally coupled to capacitor elements.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the terms "apparatus" and "system" may be used interchangeably and mean any device, system or part thereof that controls at least one operation, such a device may be implemented in hardware, firmware or software, or some combination of at least two of the same. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

The invention will now be described with reference to the accompanying drawings, in which reference numerals represent like parts, and in which.

DETAILED DESCRIPTION OF THE INVENTION

FIGS. 1 through 6, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged image processing system.

Figure 1:
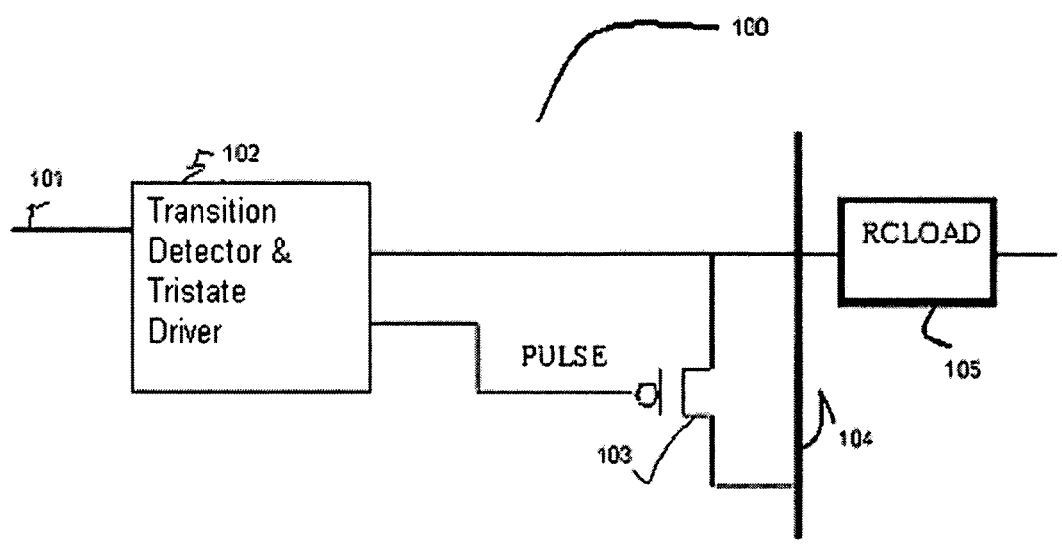
FIG. 1 shows a system for reducing power consumption in digital circuits using charge redistribution, according to this invention.

FIG. 1 shows a system for reducing power consumption in digital circuits 100 using charge redistribution for transistion of signal line 101. The said charge redistribution circuit 102 comprising transition detector and tristate driver including a control switch 103. The arrangement of transition detector, tristate driver and the switch being such that whenever the signal line 101 undergoes a transition, the charge redistribution circuit sets the source of the signal line to a high impedance and connects the signal line 101 to the floating virtual source/sink 104 for a period determined by the delay circuit provided in the transition detector of the charge redistribution circuit 102. RC load 105 is associated with the line 101.

Figure 2:
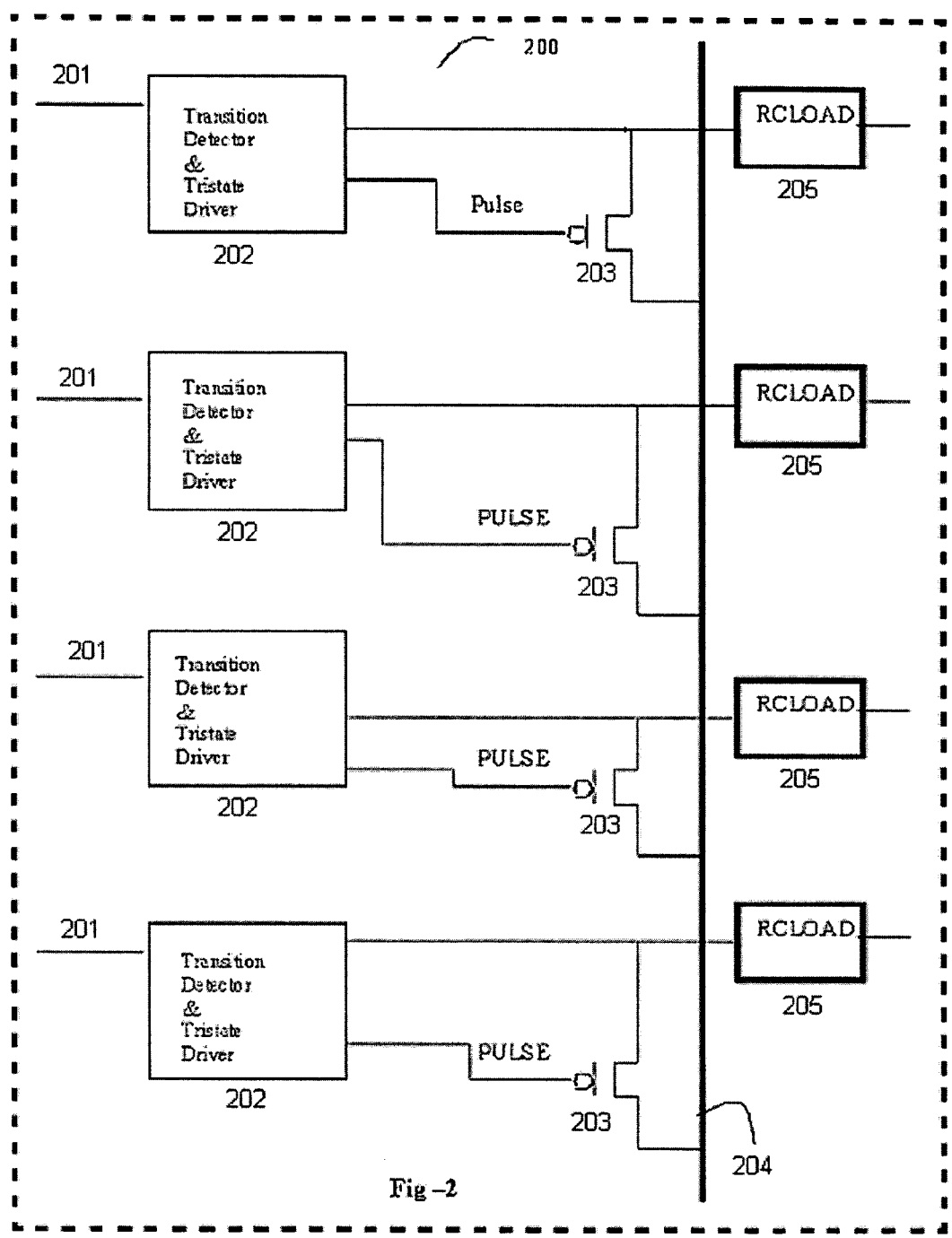
FIG. 2 shows a system for reducing power consumption in digital circuits using charge redistribution for multiple signal lines.

FIG. 2 shows a system for reducing power consumption in digital circuits 200 using charge redistribution circuit 202 in multiple signal lines 201 using floating virtual source/sink 204 extended over all the signal lines. Each signal line 201 is provided with a charge redistribution circuit 202. The charge redistribution circuit 202 comprises a transition detector, tristate driver and the switch 203. RC load 205 is associated with the line 201. The arrangement of the said charge redistribution circuit (202, 203) and the signal line 201 being such that whenever the signal line 201 undergoes a transition, the charge redistribution circuit sets the source of the signal line to a high impedance and connects the signal lines 201 to the floating virtual source/sink 204 for a period determined by the delay circuit provided in the transition detector of the charge redistribution circuit 202.

Figure 3:
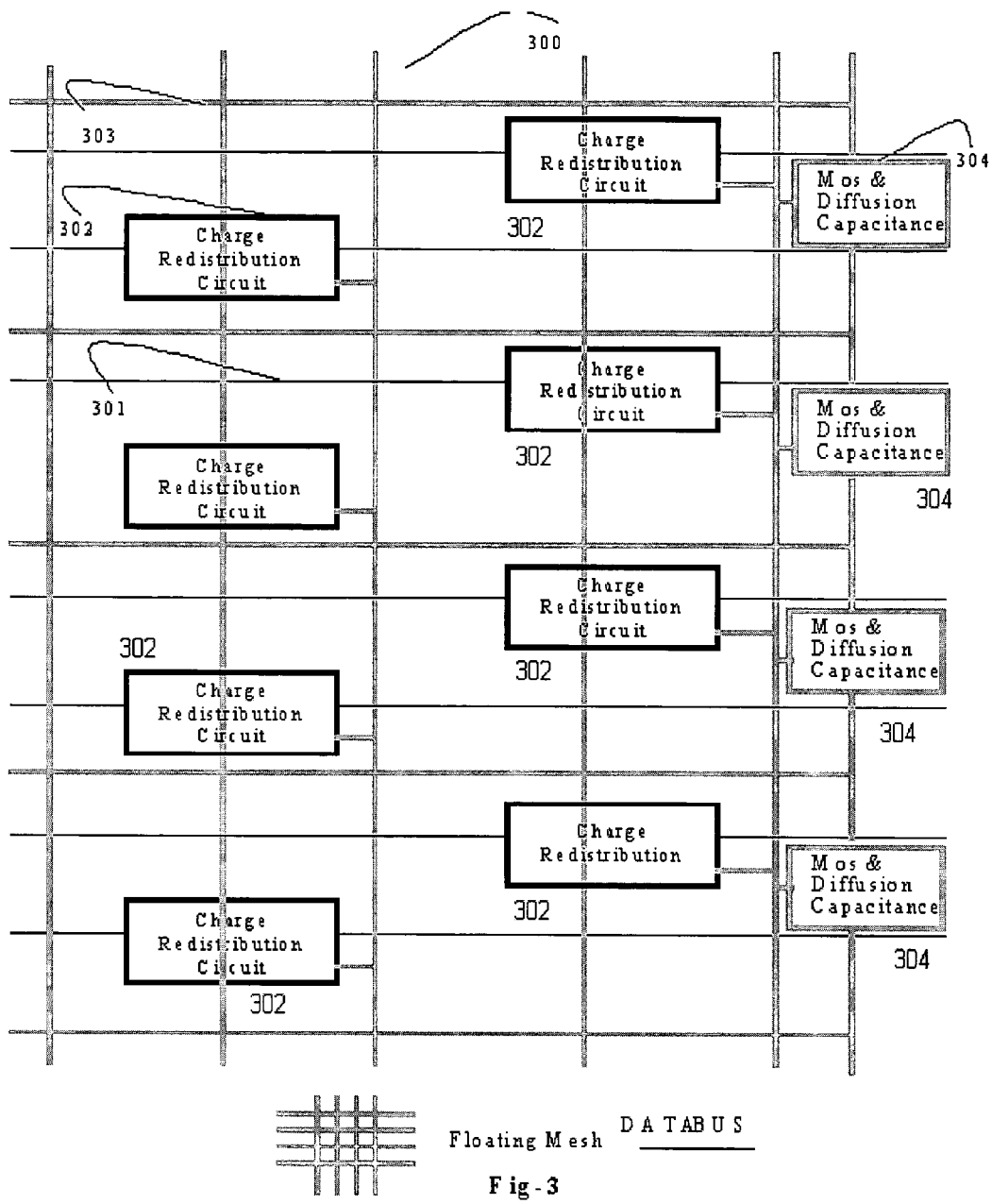
FIG. 3 shows a system for reducing power consumption in digital circuits, having a floating virtual source/sink as mesh and capacitive arrangements.

FIG. 3 shows a system for reducing power consumption in an integrated digital circuit 300, having a floating virtual source/sink as mesh 303 and capacitive arrangements 304 as applied to an integrated digital circuit. Each of the signal lines 301 is connected to a corresponding charge redistribution circuit 302. In addition, there is a floating mesh 303 connected to the charge redistribution circuits 302. This mesh 303 is present across multiple subsystems of said integrated digital circuit and may extend across the entire chip.

Initially, the capacitive mesh 303 is discharged, so only (1 to 0) transition injects charge to the mesh. The mesh gradually attains a stable intermediate value and subsequent transitions interact with this intermediate value. In the ideal case, if the intermediate value is VDD/2 then all 1 to 0 going nodes exchange charge till VDD/2 to the floating mesh before drawing power for discharging to the ground. Similarly all 0 to 1 going nodes exchange charge with the floating mesh 303 to reach VDD/2 before drawing power to charge up to the VDD supply.

Figure 4:
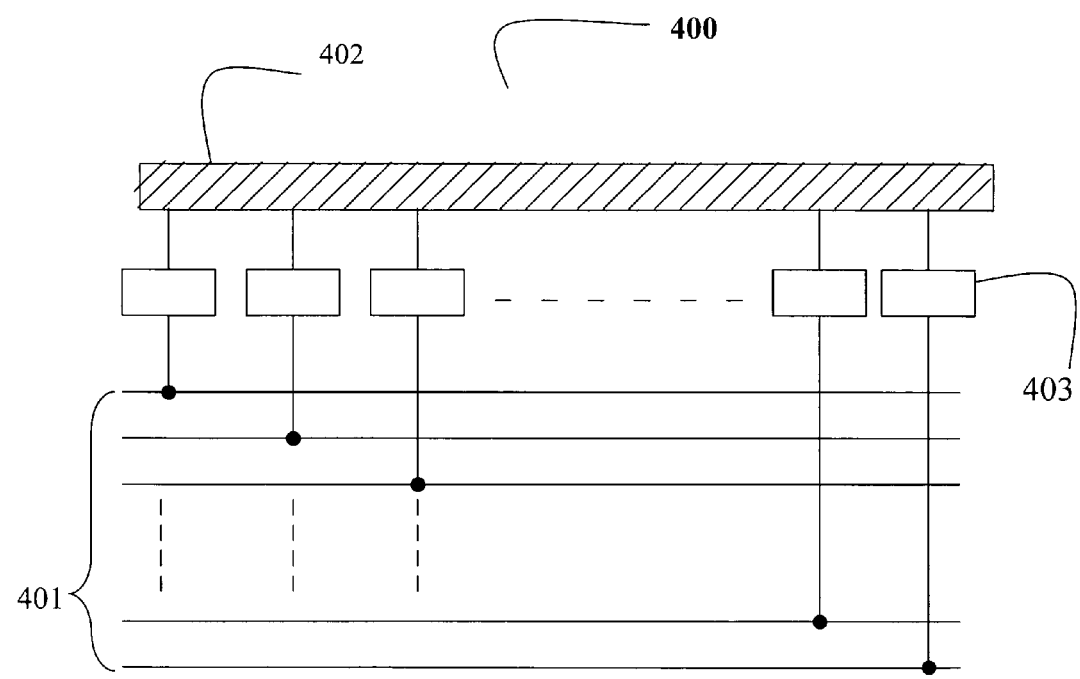
FIG. 4 shows a system for reducing power consumption in digital circuits having a floating virtual source/sink.

FIG. 4 shows a system for reducing power consumption in digital circuits 400 having a floating virtual source/sink using a conducting mesh 402, each of the signal lines 401 is connected with an intermediate virtual source/sink 402 through blocks 403. Blocks 403 detect the transitioning signal line/s 401 and connect them to an intermediate virtual source/sink 402, before the signal line/s attain/s the desired voltage level.

One of the possible embodiments for detecting and shorting the transitioning signal line (block 403) may include a transition detector, tristate driver circuit and a switch. The detailed construction of this embodiment is discussed and shown in FIGS. 5 and 6.

Figure 5:
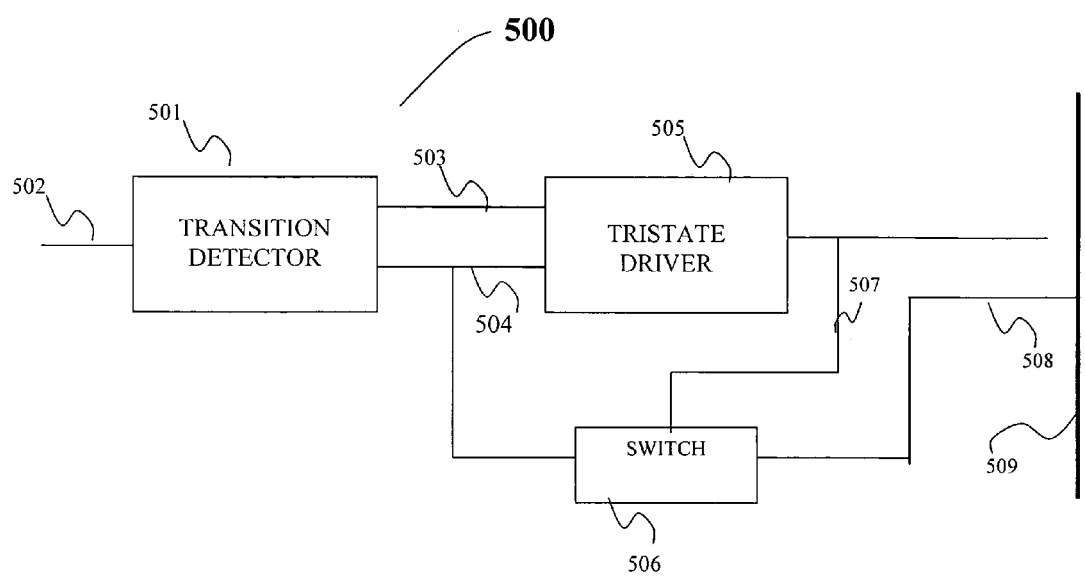
FIG. 5 shows the block diagram of a charge redistribution circuit.

FIG. 5 shows the block diagram of a charge redistribution circuit 500. A typical charge redistribution circuit comprises a transition detector 501 receiving the signal line as an input 502, providing a first output 503 and a second output 504 to the tristate driver 505. The second output 504 of the transition detector 501 is further provided to the control terminal of the control switch 506. The conducting terminals 507, 508 of the control switch 506 are connected to the output of the tristate driver and to the floating virtual source/sink 509 respectively.

When a signal line 502 undergoes a transition the transition detector 501 provides outputs to enable the tristate driver 505 to set the signal line 502 to a high impedance state and simultaneously enable the control switch 506 to connect the signal line 502 and the floating virtual source/sink for a predetermined period. The said period for connecting the floating virtual source/sink 509 and signal line 502 is determined by the transition detector.

Figure 6:
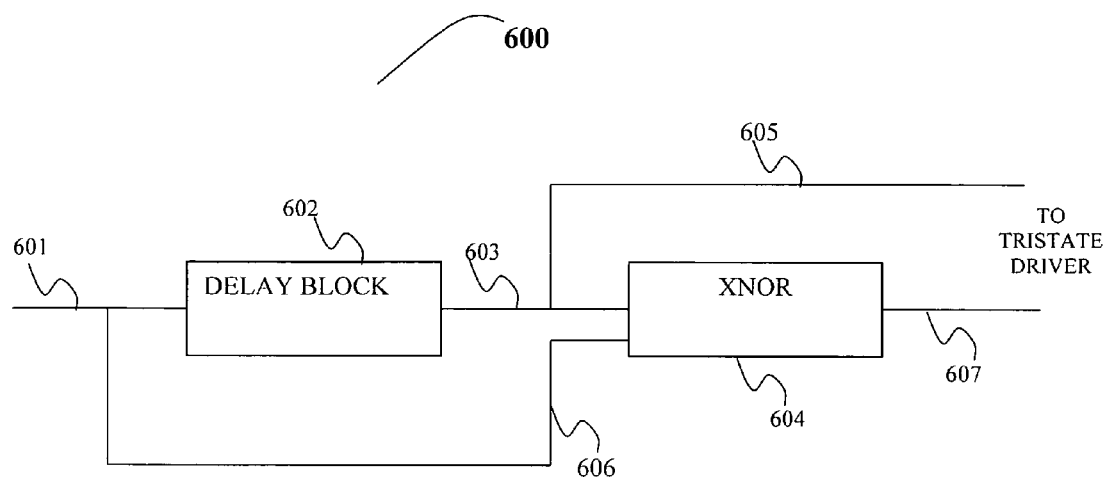
FIG. 6 shows the transition detector used in the charge redistribution circuit.

FIG. 6 shows the internal block diagram in the transition detector 600. Input signal 601 is delayed by delay circuit 602 and is connected to first input 603 of a 2-input XNOR gate 604 (or XOR gate depending upon the logic used). The delayed signal 603 is further extended as a first output 605 of the transition detector. The second input 606 of the XNOR gate 604 is directly connected to signal line 601. The output of the XNOR gate 607 is the second output of the transition detector.

When the signal line 601 undergoes a transition due to the delay circuit 602 complementary inputs are received at the inputs 603 and 606 of XNOR gate 604, resulting in a pulse at the output 607.

The foregoing description is illustrative of the best mode embodiment of the invention and is not intended to be limiting in any manner. The scope of the invention is defined solely by the accompanying claims. It is intended that the present invention encompass such changes and modifications as fall within the scope of the invention.

What is claimed is:

1. A system for reducing power consumption in digital circuits using charge redistribution, comprising:
    a plurality of signal lines;
    an intermediate floating virtual source/sink, and
    a charge redistribution circuit connected to a source and a load portion of at least one of said signal lines that isolates the load portion of said line from its source by entering a high impedance state and that connects it to the intermediate floating virtual source/sink during an idle period prior to a change of state,
    wherein the charge redistribution circuit comprises a transition detector connected to the source of one of the signal lines and having two outputs, a first of the outputs connected to an input of a tri-state driver circuit, a second of the outputs for simultaneously (i) enabling the tri-state driver circuit to enter the high impedance state and (ii) enabling a control switch to connect an output of the tri-state driver circuit to the floating virtual source/sink whenever a transition is detected on the signal line, the output of the tri-state driver circuit coupled to the load portion of the signal line, and
    wherein the transition detector comprises a delay circuit having its input connected to the source of the signal line and its output connected to the first output of the transition detector and to a first input of a 2-input exclusive-OR or exclusive-NOR gate while a second input of the gate is directly connected to the source of the signal line and its output is connected to the second output of the transition detector.

2. The system as claimed in claim 1 wherein the intermediate floating virtual source/sink comprises a charge storage element.

3. The system as claimed in claim 1 wherein the intermediate floating virtual source/sink is initially discharged.

4. The system as claimed in claim 2 wherein the charge storage element comprises a capacitor or a set of capacitors.

5. The system as claimed in claim 1 wherein the intermediate floating virtual source/sink is charged during the change of state.

6. The system as claimed in claim 4 wherein the capacitor comprises a floating conductor or a floating conducting mesh optionally coupled to capacitor elements.

7. An integrated circuit for reducing power consumption in digital circuits using charge redistribution, comprising:
    a plurality of signal lines;
    an intermediate floating virtual source/sink, and
    a charge redistribution circuit connected to a source and a load portion of at least one of said signal lines that isolates the load portion of said line from its source by entering a high impedance state and that connects it to the intermediate floating virtual source/sink during an idle period prior to a change of states,
    wherein the charge redistribution circuit comprises a transition detector connected to the source of one of the signal lines and having two outputs, a first of the outputs connected to an input of a tri-state driver circuit, a second of the outputs for simultaneously (i) enabling the tri-state driver circuit to enter the high impedance state and (ii) enabling a control switch to connect an output of the tri-state driver circuit to the floating virtual source/sink whenever a transition is detected on the signal line, the output of the tri-state driver circuit coupled to the load portion of the signal line, and
    wherein the transition detector comprises a delay circuit having its input connected to the source of the signal line and its output connected to the first output of the transition detector and to a first input of a 2-input exclusive-OR or exclusive-NOR gate while a second input of the gate is directly connected to the source of the signal line and its output is connected to the second output of the transition detector.

8. An integrated circuit as claimed in claim 7 wherein the intermediate floating virtual source/sink comprises a charge storage element.

9. An integrated circuit as claimed in claim 7 wherein the intermediate floating virtual source/sink is initially discharged.

10. An integrated circuit as claimed in claim 8 wherein the charge storage element comprises a capacitor or a set of capacitors.

11. An integrated circuit as claimed in claim 8 wherein the intermediate floating virtual source/sink is charged during the change of state.

12. An integrated circuit as claimed in claim 10 wherein the capacitor comprises a floating conductor or a floating conducting mesh optionally coupled to capacitor elements.

13. A method for reducing power consumption in digital circuits using charge redistribution, comprising the steps of:
    providing a plurality of signal lines;
    providing an intermediate floating virtual source/sink, and
    isolating a load portion of at least one of said signal lines from its source by (i) placing a charge redistribution circuit connected to the source and the load portion of one of the signal lines in a high impedance state and (ii) connecting the load portion of the signal line to the intermediate floating virtual source/sink during an idle period prior to a change of states, wherein the charge redistribution circuit comprises a transition detector connected to the source of one of the signal lines and having two outputs, a first of the outputs connected to an input of a tri-state driver circuit, a second of the outputs for simultaneously (i) enabling the tri-state driver circuit to enter the high impedance state and (ii) enabling a control switch to connect an output of the tri-state driver circuit to the floating virtual source/sink whenever a transition is detected on the signal line, the output of the tri-state driver circuit coupled to the load portion of the signal line, and wherein the transition detector comprises a delay circuit having its input connected to the source of the signal line and its output connected to the first output of the transition detector and to a first input of a 2-input exclusive-OR or exclusive-NOR gate while a second input of the gate is directly connected to the source of the signal line and its output is connected to the second output of the transition detector.

14. The method as claimed in claim 13 wherein the step of providing an intermediate floating virtual source/sink comprises supplying a charge storage element.

15. The method as claimed in claim 13 wherein the change of state is identified by detecting a transition on the signal line.

16. The method as claimed in claim 14 wherein the charge storage element is supplied by connecting a capacitor or a set of capacitors.

17. The method as claimed in claim 15 wherein the transition is detected by exclusive-NORing or exclusive-ORing a signal on the signal line with a delayed version of the signal.

18. The method as claimed in claim 15 wherein the load portion of the signal line is connected to the intermediate floating virtual source/sink whenever the transition is detected.

19. The method as claimed in claim 16 wherein the capacitor is provided by a floating conductor or a floating conducting mesh optionally coupled to capacitor elements.

20. The method as claimed in claim 13, wherein isolating the load portion of the signal line from its source and connecting the load portion of the signal line to the intermediate floating virtual source/sink comprise:

placing a tri-state driver circuit in the charge redistribution circuit in the high impedance state; and simultaneously enabling a control switch to connect an output of the tri-state driver circuit to the floating virtual source/sink, the output of the tri-state driver circuit coupled to the load portion of the signal line.

* * * * *

UNITED STATES PATENT AND TRADEMARK OFFICE
CERTIFICATE OF CORRECTION

| | | |
|---|---|---|
| PATENT NO. | : 7,116,137 B2 | Page 1 of 1 |
| APPLICATION NO. | : 10/768962 | |
| DATED | : October 3, 2006 | |
| INVENTOR(S) | : Vivek Nautiyal and Ashish Kumar | |

It is certified that error appears in the above-identified patent and that said Letters Patent is hereby corrected as shown below:

Title page, item [57] Abstract on line 2, delete "include" after the term "redistribution" and replace it with -- including --;

Column 2, line 59, delete "fate" and replace with -- gate --;

Column 4, line 3, delete "image processing system" and replace with -- system for reducing power consumption --;

Column 7, claim 13, line 2, delete "states" and replace with -- state --.

Signed and Sealed this

Twenty-seventh Day of March, 2007

JON W. DUDAS
*Director of the United States Patent and Trademark Office*